US012642117B2

(12) United States Patent
Shin et al.

(10) Patent No.: US 12,642,117 B2
(45) Date of Patent: May 26, 2026

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Narae Shin, Suwon-si (KR); Youngbae Kim, Suwon-si (KR); Youngjun Yoon, Suwon-si (KR); Jeongkyu Ha, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 433 days.

(21) Appl. No.: 18/318,827

(22) Filed: May 17, 2023

(65) Prior Publication Data

US 2024/0088003 A1      Mar. 14, 2024

(30) Foreign Application Priority Data

Sep. 13, 2022      (KR) ........................ 10-2022-0114716

(51) Int. Cl.
  *H10W 70/685*          (2026.01)
  *H10W 70/65*          (2026.01)
          (Continued)

(52) U.S. Cl.
  CPC ......... *H10W 70/685* (2026.01); *H10W 70/65* (2026.01); *H10W 74/15* (2026.01); *H10W 90/724* (2026.01); *H10W 90/734* (2026.01)

(58) Field of Classification Search
  CPC ................. H01L 24/83; H01L 23/4985; H01L 23/49838; H01L 23/49822; H01L 24/73;
          (Continued)

(56) References Cited

U.S. PATENT DOCUMENTS 6,388,888 B1 *    5/2002    Seko ................... H01L 23/4985
                                                                438/114
7,299,547 B2    11/2007    Choi et al.
          (Continued)

FOREIGN PATENT DOCUMENTS

JP          2003-347366 A      12/2003
KR          10-0175033          5/1999
          (Continued)

OTHER PUBLICATIONS

Office Action issued Feb. 11, 2026 in Korean Application No. 10-2022-0114716.

*Primary Examiner* — Mouloucoulaye Inoussa
(74) *Attorney, Agent, or Firm* — Harness, Dickey & Pierce, P.L.C.

(57)          ABSTRACT

A semiconductor package includes a film substrate; a plurality of wires on an upper surface of the film substrate; an upper insulating film covering the plurality of wires on the upper surface of the film substrate and defining a plurality of pad openings and a mounting region opening such that, the plurality of pad openings expose at least a portion of an outer lead bonding portion of the plurality of wires along at least one of the first side surface or the second side surface and the mounting region opening exposes at least a portion of an inner lead bonding portion of the plurality of wiring; a semiconductor chip bonded to and electrically connected to the exposed inner lead bonding portion, and at least one support pattern on a lower surface of the film substrate and extending in the first direction to overlap with the plurality of pad openings.

20 Claims, 10 Drawing Sheets

(51) Int. Cl.
    *H10W 74/15*        (2026.01)
    *H10W 90/00*        (2026.01)

(58) Field of Classification Search
    CPC ..... H01L 24/32; H01L 24/16; H01L 23/3185;
             H01L 23/5386; H01L 23/3735; H01L
             21/563; H01L 23/367; H01L 23/5387;
             H01L 24/17; H01L 23/3672; H01L
             25/072; H01L 24/12; H01L 23/3736;
             H01L 23/49568; H01L 21/4882; H01L
             23/3675; H01L 23/49572; H01L
             2224/16227; H01L 2224/32225; H01L
             2224/73204; H01L 2924/18161; H01L
             2924/14; H01L 2924/00014; H01L
             2224/17519; H01L 2224/16225; H01L
             2924/1611; H01L 2924/1617; H01L
             2224/92125; H01L 2924/1426; H01L
                                            2224/131
    See application file for complete search history.

(56)                References Cited

U.S. PATENT DOCUMENTS

|  |  |  |  |
|---|---|---|---|
| 7,895,742 | B2 | 3/2011 | Choi et al. |
| 8,102,046 | B2 * | 1/2012 | Iwata .................. H01L 23/4985 |
|  |  |  | 257/713 |
| 9,142,429 | B2 * | 9/2015 | Chahal ..................... H10D 1/68 |
| 10,168,582 | B1 * | 1/2019 | Su ....................... G02F 1/13394 |
| 10,354,967 | B2 | 7/2019 | Kim et al. |
| 2008/0258290 | A1 * | 10/2008 | Nakajima ............... H01L 24/27 |
|  |  |  | 438/118 |

| 2009/0273076 | A1 * | 11/2009 | Choi .................... H05K 1/0203 |
|---|---|---|---|
|  |  |  | 257/E23.101 |
| 2011/0204497 | A1 | 8/2011 | Matsuda et al. |
| 2011/0304911 | A1 * | 12/2011 | Chi ....................... H04N 13/346 |
|  |  |  | 359/471 |
| 2012/0211877 | A1 * | 8/2012 | Iwane ................... H01L 21/563 |
|  |  |  | 438/126 |
| 2016/0148881 | A1 * | 5/2016 | Park ........................ H01L 23/60 |
|  |  |  | 257/659 |
| 2016/0190408 | A1 * | 6/2016 | Kamada ............... H10H 20/853 |
|  |  |  | 257/88 |
| 2017/0162487 | A1 * | 6/2017 | Huang ................ H01L 23/3164 |
| 2018/0026008 | A1 * | 1/2018 | Jeng ................... H01L 23/5389 |
|  |  |  | 257/692 |
| 2018/0090459 | A1 * | 3/2018 | Kim ........................ H01L 24/81 |
| 2018/0331049 | A1 * | 11/2018 | Huang ............. H01L 23/49827 |
| 2018/0342437 | A1 * | 11/2018 | Huang .................. H01L 23/367 |
| 2019/0067168 | A1 * | 2/2019 | Huang ............... H01L 21/4846 |
| 2019/0363051 | A1 * | 11/2019 | Jung ................... H01L 23/5386 |
| 2020/0035644 | A1 * | 1/2020 | Choi ..................... H01L 23/552 |
| 2020/0214136 | A1 * | 7/2020 | Kuo ................... H01L 23/4985 |
| 2021/0183781 | A1 * | 6/2021 | Liao ................... H01L 23/3185 |
| 2022/0352105 | A1 * | 11/2022 | Nishimura .............. H01L 25/18 |
| 2023/0178450 | A1 * | 6/2023 | Jo ......................... H01L 23/145 |
|  |  |  | 257/678 |

FOREIGN PATENT DOCUMENTS

| KR | 10-0658442 | B1 | 12/2006 |
|---|---|---|---|
| KR | 10-0712530 | B1 | 4/2007 |
| KR | 10-0944274 | B1 | 2/2010 |
| KR | 10-1223701 | B1 | 1/2013 |

\* cited by examiner

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application No. 10-2022-0114716, filed on Sep. 13, 2022 in the Korean Intellectual Property Office (KIPO), the contents of which are herein incorporated by reference in their entirety.

BACKGROUND

1. Field

Example embodiments relate to a semiconductor package and a method of manufacturing the semiconductor package. More particularly, example embodiments relate to a semiconductor package including a film substrate and a method of manufacturing the same.

2. Description of the Related Art

A chip on film (COF) semiconductor package may be formed by bonding a metal lead portion of a film substrate and bumps of a semiconductor chip through a thermal compression process. During the thermal compression process, the film substrate expands and then contracts due to high-temperature heat, and an undulation phenomenon may occur on the film substrate. Due to the undulation phenomenon, irregular shrinkage may occur on the film substrate, and misalignment may occur when the film is bonded to a semiconductor device.

SUMMARY

Example embodiments provide a semiconductor package including a support pattern for preventing irregular shrinkage.

Example embodiments provide a method of manufacturing the semiconductor package.

According to some example embodiments, a semiconductor package includes a film substrate including a chip mounting region, an upper surface, a lower surface, and first and second side surfaces extending in a first direction such that the film substrate is elongated in the first direction; a plurality of wires on the upper surface of the film substrate, the plurality of wires including a metal lead portion having an inner lead bonding portion at least partially within the chip mounting region and an outer lead bonding portion extending from the inner lead bonding portion to at least one of the first side surface or the second side surface; an upper insulating film on the upper surface of the film substrate, the upper insulating film defining a plurality of pad openings and a mounting region opening such that the plurality of pad openings exposes at least a portion of the outer lead bonding portion along the at least one of the first side surface or the second side surface, and the mounting region opening exposes at least a portion of the inner lead bonding portion on the chip mounting region; a semiconductor chip on the chip mounting region of the film substrate such that the semiconductor chip is bonded to and electrically connected to the exposed inner lead bonding portion, and at least one support pattern on the lower surface of the film substrate and extending in the first direction such that the at least one support pattern overlaps with the plurality of pad openings along at least one of the first side surface or the second side surface.

According to some example embodiments, a semiconductor package includes a film substrate including a chip mounting region, an upper surface, a lower surface, and first and second side surfaces extending in a first direction such that the film substrate is elongated in the first direction; a plurality of wires on the upper surface of the film substrate, the plurality of wires including a metal lead portion having an inner lead bonding portion at least partially within the chip mounting region and outer lead bonding portions respectively extending from the inner lead bonding portion to one of the first side surface or the second side surface; an upper insulating film on the upper surface of the film substrate and covering the plurality of wires, the upper insulating film defining a plurality of pad openings and a mounting region opening such that the plurality of pad openings exposes at least a portion of the outer lead bonding portions along the first side surface and the second side surface, and the mounting region opening exposes at least a portion of the inner lead bonding portion on the chip mounting region along the first direction; a semiconductor chip on the chip mounting region of the film substrate such that the semiconductor chip is bonded to and electrically connected to the exposed inner lead bonding portion, and first and second support patterns on the lower surface of the film substrate and respectively extending in the first direction to overlap with the pad openings along the first and second side surfaces.

According to some example embodiments, a semiconductor package includes a film substrate including an upper surface, a lower surface; a plurality of wires on the upper surface of the film substrate, the plurality of wires including a metal lead portion having an inner lead bonding portion, at least one first outer lead bonding portion extending from the inner lead bonding portion and at least one second outer lead bonding portion extending from the inner lead bonding portion in a direction opposite to the first outer leading bonding portion; an upper insulating film on the plurality of wires, the upper insulating film defining a plurality of pad openings and a mounting region opening such that the plurality of pad openings are arranged along a first direction and expose outer ends of the first and second outer lead bonding portions, and the mounting region opening exposing at least a portion of the inner lead bonding portion along the first direction; a semiconductor device on the film substrate such that the semiconductor device is bonded to and electrically connected to the exposed inner lead bonding portion, an adhesive member filling a space between the film substrate and the semiconductor device; and first and second support patterns on the lower surface of the film substrate and respectively extending from a front surface of the film substrate to a rear surface opposite to the front surface such that the first and second support patterns respectively overlap with outer ends of the exposed first and second outer lead bonding portions.

According to some example embodiments, a semiconductor package may include a film substrate having a chip mounting region including upper and lower surfaces opposite to each other and first and second side surfaces extending in a first direction such that the film substrate is elongated in the first direction; a plurality of wires on the upper surface of the film substrate, the plurality of wires including a metal lead portion having an inner lead bonding portion at least partially within the chip mounting region and an outer lead bonding portion extending from the inner lead bonding portion to at least one of the first side surface or the second side surface; an upper insulating film on the upper surface of the film substrate and covering the plurality of wires, the upper insulating film defining a plurality of pad openings and a mounting region opening such that the plurality of pad openings exposes at least a portion of the outer lead bonding portions along the first side surface and the second side surface, and the mounting region opening exposes at least a portion of the inner lead bonding portion on the chip mounting region along the first direction; a semiconductor chip on the chip mounting region of the film substrate such that the semiconductor chip is bonded to and electrically connected to the exposed inner lead bonding portion; and at least one support pattern on the lower surface of the film substrate extending in the first direction such that the at least support pattern to overlaps with the plurality of pad openings along at least one of the first side surface or the second side surface.

Thus, in a process of mounting the semiconductor chip on the inner lead bonding portion through a thermal compression process, the support pattern may support the film substrate in an outer lead bonding OLB area. Since the support pattern supports the lower surface of the film substrate, the support pattern may generate a uniform shrinkage phenomenon of the film substrate in an exposed area of the OLB portion. When the uniform shrinkage phenomenon occurs in the film substrate, a rate of change of the film substrate may be more accurately predicted. When the rate of change of the film substrate is accurately predicted, a misalignment phenomenon may be mitigated and/ or prevented in a process of bonding another semiconductor device to the outer lead bonding portion.

BRIEF DESCRIPTION OF THE DRAWINGS

Example embodiments will be more clearly understood from the following detailed description taken in conjunction with the accompanying drawings.

FIG. 1 is a plan view illustrating a semiconductor device in accordance with some example embodiments.

FIG. 2 is a plan view illustrating a semiconductor package in FIG. 1 in accordance with some example embodiments.

FIG. 3 is a cross-sectional view taken along the line A-A' in FIG. 2.

FIG. 4 is a plan view illustrating a lower surface of the semiconductor package in FIG. 1.

FIGS. 5 to 10 are cross-sectional views illustrating a method of manufacturing a semiconductor package in accordance with some example embodiments.

DETAILED DESCRIPTION OF EXAMPLE EMBODIMENTS

Figure 1:
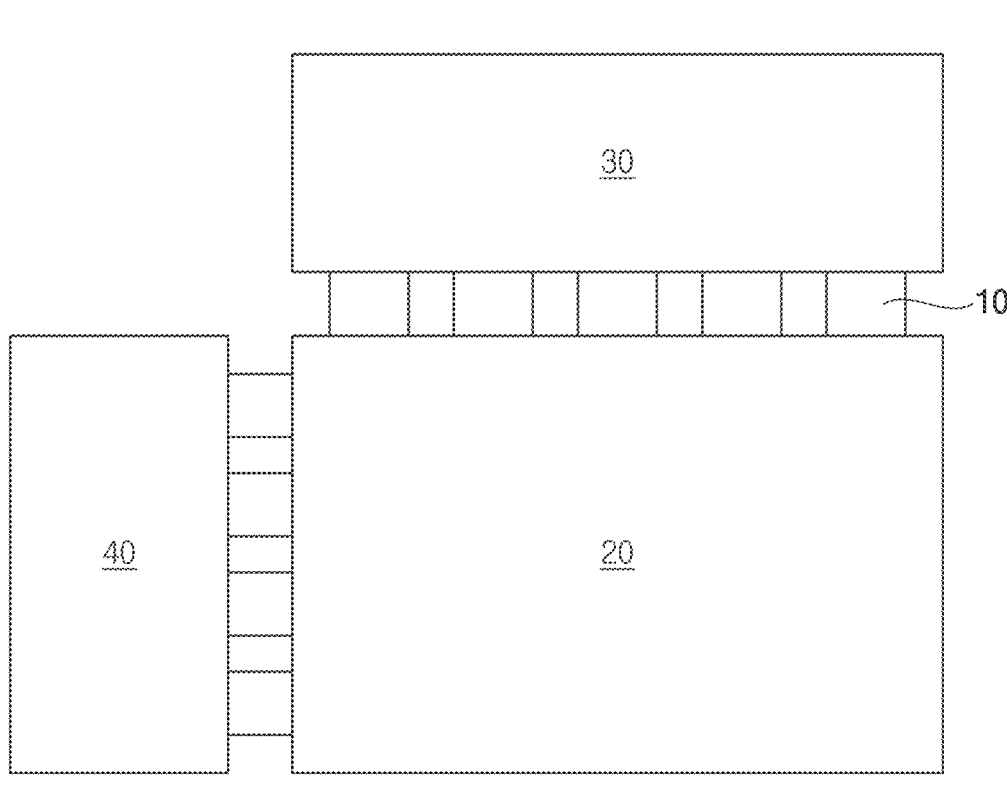
FIGS. 1 to 10 represent non-limiting, example embodiments as described herein.

Hereinafter, example embodiments will be explained in detail with reference to the accompanying drawings. In the description and in the accompanying drawings, like numerals refer to like elements throughout. Therefore, the repeated descriptions of like element may be omitted. In the drawings, the thickness of layers, films, panels, regions, etc., may be exaggerated for clarity.

When the terms "about" are used in this specification in connection with a numerical value, it is intended that the associated numerical value includes a manufacturing tolerance (e.g., ±10%) around the stated numerical value. Further, regardless of whether values are modified as "about" or "substantially," it will be understood that these values should be construed as including a manufacturing or operational tolerance (e.g., ±10%) around the stated values.

Spatially relative terms, such as "lower," "under," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly.

The terms "first", "second", "third", etc. may be used to describe various elements, but are used only for the purpose of distinguishing one element from another element from another element, and the order or type of the elements are not otherwise limited.

Figure 2:
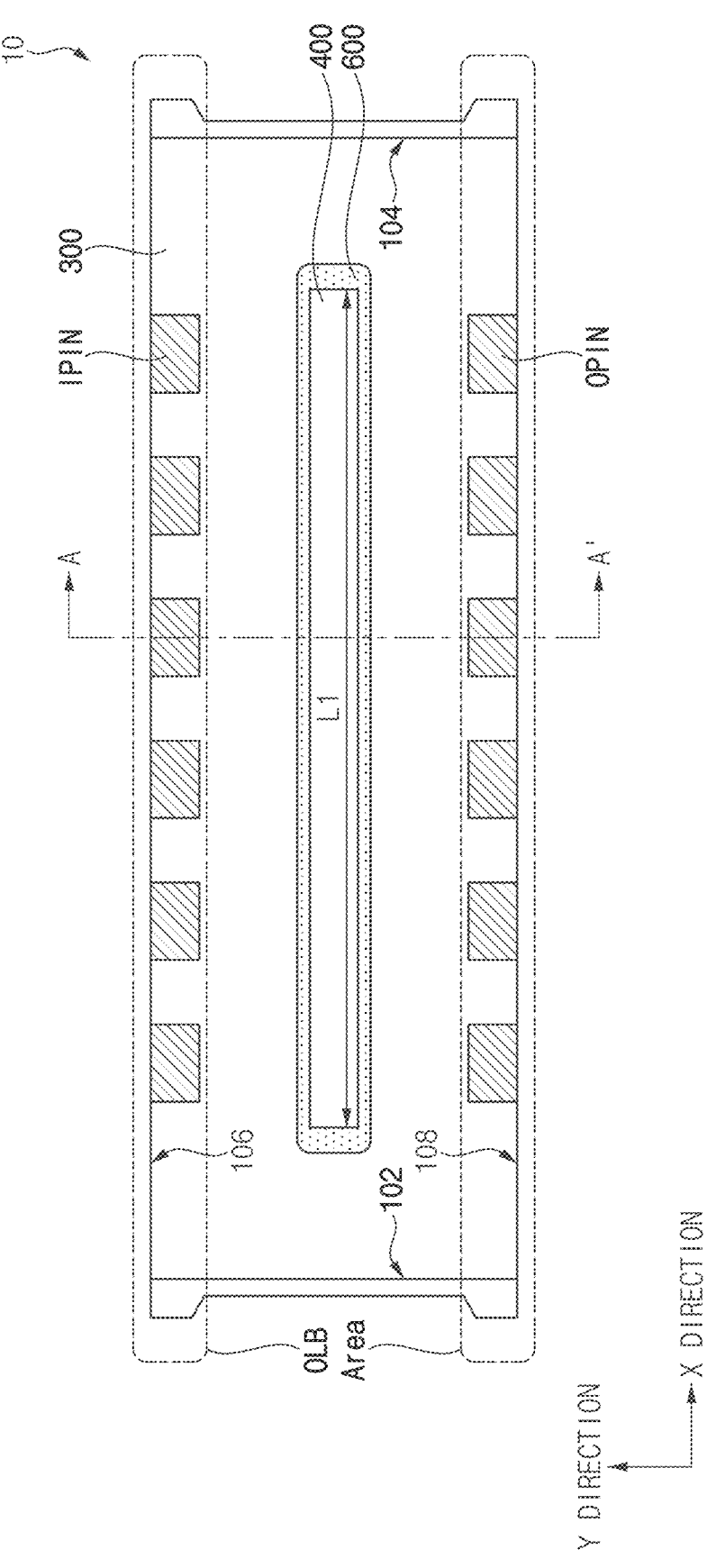
Figure 3:
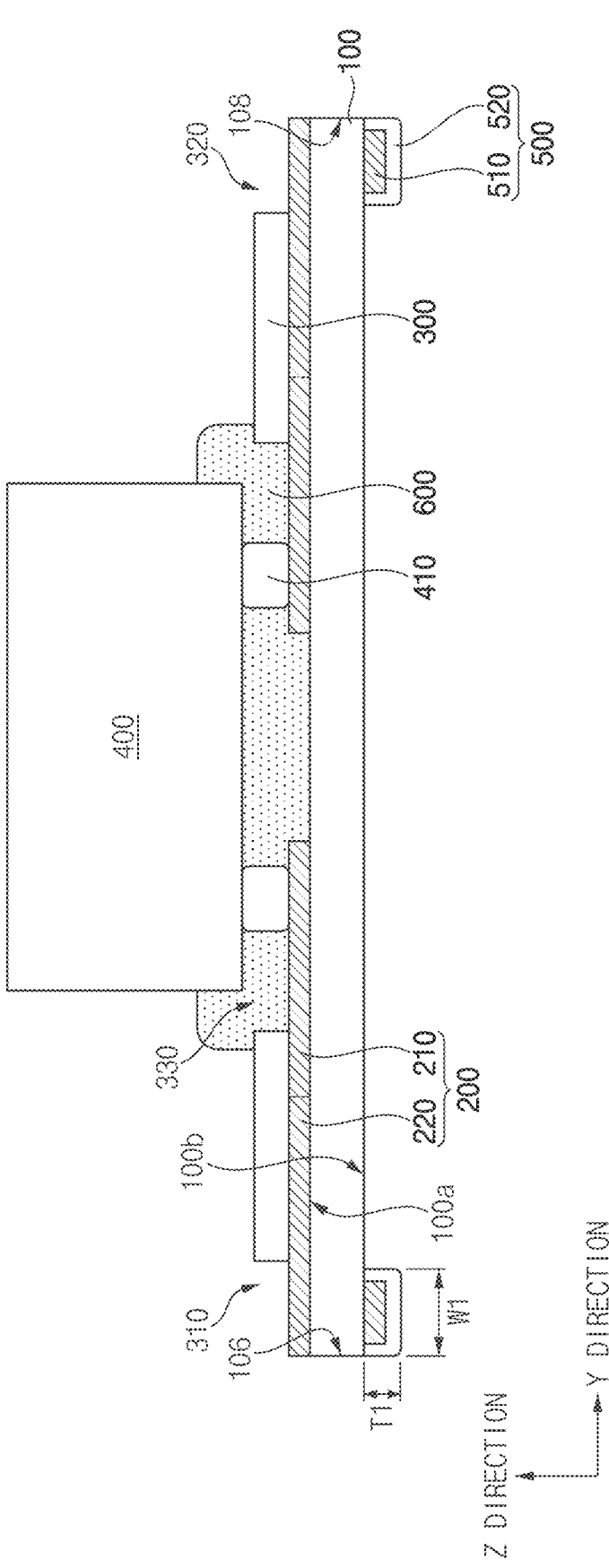
Figure 4:
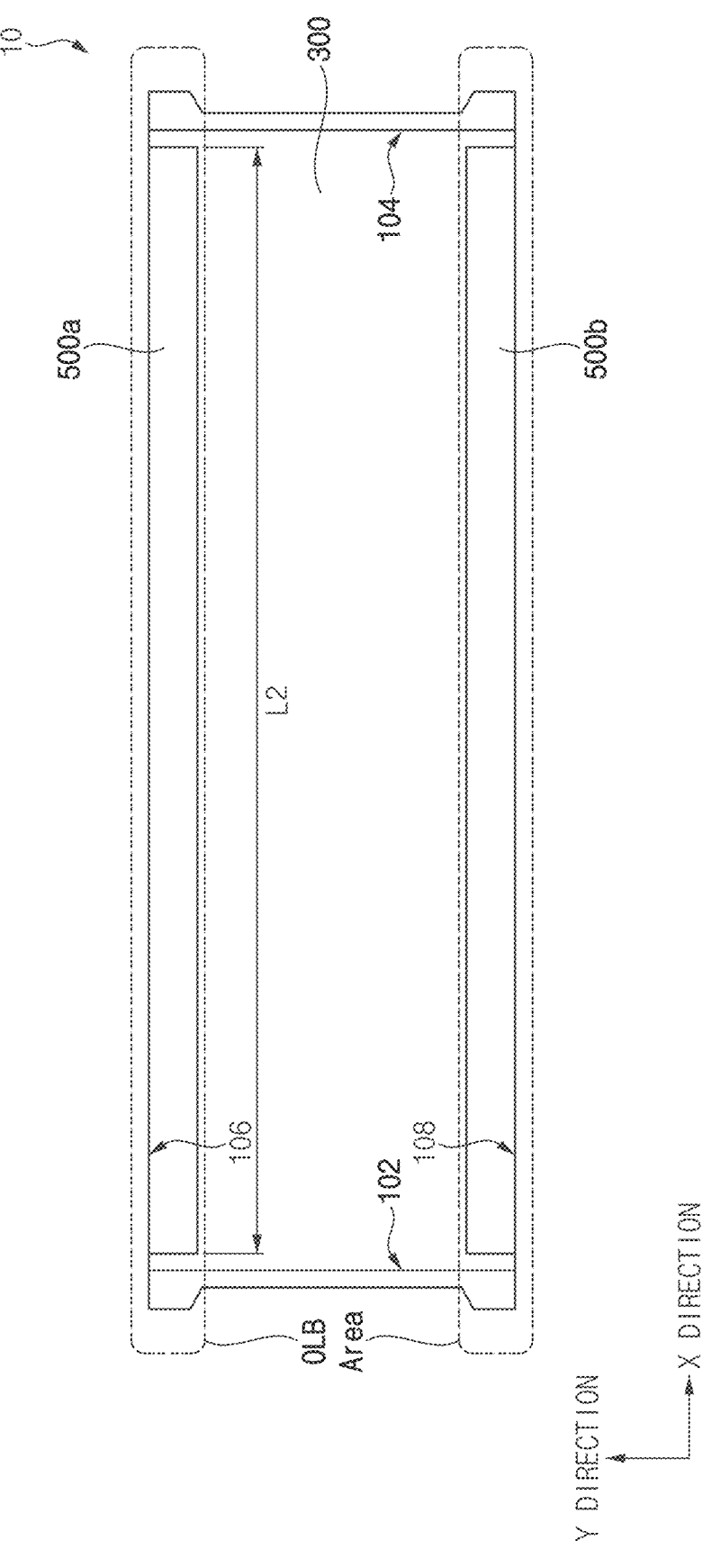

FIG. 1 is a plan view illustrating a semiconductor device in accordance with some example embodiments. FIG. 2 is a plan view illustrating a semiconductor package in FIG. 1 in accordance with some example embodiments. FIG. 3 is a cross-sectional view taken along the line A-A' in FIG. 2. FIG. 4 is a plan view illustrating a lower surface of the semiconductor package in FIG. 1.

Referring to FIGS. 1 to 4, a semiconductor device 1 may include a film type semiconductor package 10, first and second semiconductor substrates 30 and 40, and a display panel 20. The first semiconductor substrate 30 may include (or be referred to as) a source drive substrate. The second semiconductor substrate 40 may include (or be referred to as) a gate drive substrate.

The source drive substrate 30 and the gate drive substrate 40 may provide signals to the display panel 20 such that an appropriate image is displayed by the pixels of the display panel 20. For example, the display panel 20 may display an image based on the received signal. The film type semiconductor package 10 may receive signals output from the source drive substrate 30 and the gate drive substrate 40 and may transmit them to the display panel 20.

In some example embodiments, the semiconductor package 10 may include a film substrate 100, a plurality of wires provided on the film substrate 100 and having metal lead portion 200, an upper insulating film 300 provided on the metal lead portion 200, a semiconductor chip 400 disposed on the metal lead portion 200, and a support pattern 500 provided on a lower surface of the film substrate 100. The semiconductor package 10 may electrically connect the semiconductor chip 400, the source drive substrate 30, the gate drive substrate 40, and the display panel 20 through the metal lead portion 200. For example, the semiconductor package 10 may be referred to a chip on film (COF) semiconductor package.

The film substrate 100 may have an upper surface 100a, and a lower surface 100b opposite to the upper surface 100a. The film substrate 100 may have a first direction (X direction) between a front surface 102 and an opposite rear surface 104, and a second direction (Y direction) orthogonal to the first direction (X direction). The film substrate 100 may have first and second side surfaces 106 and 108 facing each other. The film substrate 100 may have a chip mounting region in which the semiconductor chip 400 is mounted. For example, the film substrate 100 may be a printed circuit board (PCB). The film substrate 100 may be an epoxy and/or polymer based substrate, like a polyimide substrate.

In some example embodiments, the metal lead portion 200 may include an inner lead bonding portion (ILB) 210 and an outer lead bonding portion (OLB) 220. The outer lead bonding portion 220 may be provided in an outer area (OLB area) disposed along the first direction (X direction) on the outer area of the film substrate 100. The inner lead bonding portion 210 and the outer lead bonding portion 220 may extend from the upper surface 100a in a length direction (e.g., the Y direction) of the film substrate 100. The metal lead portion 200 may be variously disposed on the film substrate 100 according to design.

At least a portion of the inner lead bonding portion 210 may be disposed within the chip mounting region. The inner lead bonding portion 210 may be bonded to conductive patterns 410 of the semiconductor chip 400. The conductive patterns 410 may, for example, comprise solder such as a solder pillars and/or balls. The inner lead bonding portion 210 may be electrically connected to the semiconductor chip 400 through the conductive patterns 410. The inner lead bonding portion 210 may extend from the outer lead bonding portion 220 in the length direction of the film substrate 100.

The outer lead bonding portion 220 may be bonded and electrically connected to each of the display panel 20, the source drive substrate 30, and the gate drive substrate 40.

The outer lead bonding portion 220 may extend from the inner lead bonding portion 210 to at least one of the first side surface 106 and the second side surface 108. The outer lead bonding portion 220 may extend from the inner lead bonding portion 210 in the length direction of the film substrate 100.

At least a portion of the outer lead bonding portion 220 may include input pins IPIN and output pins OPIN for transmitting and receiving electrical signals to and from the display panel 20, the source drive substrate 30, or the gate drive substrate 40, respectively. The outer lead bonding portion 220 serving as the input/output pins IPIN, OPIN may be arranged along the outer area (OLB area) on the film substrate 100. The input pins IPIN may be arranged along the first side surface 106 of the film substrate 100, and the output pins OPIN may be arranged along the second side surface 108 opposite to the first side surface 106.

For example, the metal lead portion 200 may include at least one of copper (Cu), aluminum (Al), tungsten (W), nickel (Ni), molybdenum (Mo), gold (Au), silver (Ag), chromium (Cr), tin (Sn), titanium (Ti), stainless steel (SUS), and/or the like.

In some example embodiments, the upper insulating film 300 may cover the plurality of wires on the upper surface 100a of the film substrate 100. The upper insulating film 300 may be provided on the metal lead portion 200. The upper insulating film 300 may be provided on a boundary region where the inner lead bonding portion 210 and the outer lead bonding portion 220 extend from each other.

The upper insulating film 300 may expose at least the portion of the outer lead bonding portion 220. The upper insulating film 300 may expose input pins IPIN and output pins OPIN of the outer lead bonding portion 220. The upper insulating film 300 may have a ring shape with a set (and/or preset) gap. The upper insulating film 300 may mount the semiconductor chip 400 on the metal lead portion 200 through an open inner portion of the ring shape.

The upper insulating film 300 may provide a plurality of openings that electrically connects at least the portion of the exposed outer lead bonding portion 220 to the semiconductor chip 400, the display panel 20, the source drive substrate 30, or the gate drive substrate 40, respectively. Input pins IPIN and output pins OPIN may be exposed through the openings.

The upper insulating film 300 may include a plurality of pad openings 310 and 320 that expose at least the portion of the outer lead bonding portion 220 along at least one of the first side surface 106 and the second side surface 108. The upper insulating film 300 may include a mounting region opening 330 that exposes at least the portion of the inner lead bonding portion 210 on the chip mounting region.

The upper insulating film 300 may include first pad openings 310 that expose at least the portion of the outer lead bonding portion 220 along the first side surface 106, and second pad openings 320 that expose at least the portion of the outer lead bonding portion 220 along the second side surface 108. The outer lead bonding portion 220 may be electrically connected to the display panel 20, the source drive substrate 30, or the gate drive substrate 40 through the first and second pad openings 310 and 320. For example, the first and second pad openings 310 and 320 may be arranged along the first direction (X direction) of the film substrate 100. The upper insulating film 300 may include the mounting region opening 330 that exposes at least the portion of the inner lead bonding portion 210. The inner lead bonding portion 210 may be electrically connected to the semiconductor chip 400 through the mounting region opening 330. For example, the mounting region opening 330 may be arranged along the first direction (X direction) of the film substrate 100.

In some example embodiments, the upper insulating film 300 may include a polymer or a dielectric layer. For example, the upper insulating film 300 may include at least one of polyimide (PI), lead oxide (PbO), polyhydroxystyrene (PHS), epoxies (such as novolac), and/or the like. The upper insulating film 300 may be formed by a vapor deposition process, a spin coating process, and/or the like.

In some example embodiments, the semiconductor chip 400 may be mounted on the metal lead portion 200. The semiconductor chip 400 may be bonded to and electrically connected to the inner lead bonding portion 210 of the metal lead portion 200. For example, the semiconductor chip 400 may be bonded to the inner lead bonding portion 210 through a thermal compression process.

The semiconductor chip 400 may include a plurality of the conductive patterns 410 that are exposed from a lower surface. The semiconductor chip 400 may be mounted on the metal lead portion 200 through the conductive patterns 410, and may electrically connected to the display panel 20, the source drive substrate 30 or the gate drive substrate 40. The conductive patterns 410 of the semiconductor chip 400 may be bonded to and electrically connected to the inner lead bonding portion 210 of the metal lead portion 200. The semiconductor chip 400 may be electrically connected to the input/output pins IPIN, OPIN of the metal lead portion 200.

The semiconductor chip 400 may have a first length L1 along the first direction (X direction). The first length L1 of the semiconductor chip 400 may be shorter than a length of the open inner portion of the ring shape of the metal lead portion 200, and the semiconductor chip 400 may be inserted into the open inner portion of the ring shape, and may be bonded to the metal lead portion 200.

In some example embodiments, the semiconductor package 10 may further include an electronic element. The electronic element may be bonded to the metal lead portion 200. The electronic element may be bonded to the metal lead portion 200 through an opening provided in the upper insulating film 300. For example, the electronic element may perform various functions as a surface mount device. The electronic element may include active devices, passive devices, and other electronic components and/or semiconductor chips.

In example embodiments, at least one of the support patterns 500 may be provided on the lower surface 100b of the film substrate 100. The support pattern 500 may extend along the outer area (OLB area) on the film substrate 100. The support pattern 500 may extend along the outer lead bonding portion 220 that is exposed from the upper insulating film 300 in the outer area. The support pattern 500 may extend along the first and second pad openings 310 and 320 that expose the outer lead bonding portion 220 of the upper insulating film 300. The support pattern 500 may extend along the first direction (X direction) of the film substrate 100.

The support pattern 500 may include a first support pattern 500a that extends along the first side surface 106 of the film substrate 100, and a second support pattern 500b that extend along the second side surface 108 opposite to the first side surface 106. The first and second support patterns 500a and 500b may extend parallel to each other.

The support pattern 500 may include a second metal lead portion 510 electrically insulated from other electronic devices and a lower insulating film 520 surrounding the second metal lead portion 510. The second metal lead portion 510 may include a metal material, and may support the lower surface 100b of the film substrate 100 through the metal material.

For example, the lower insulating film 520 may include a polymer or a dielectric layer. Particularly, the lower insulating film 520 may include polyimide (PI), lead oxide (PbO), polyhydroxystyrene (PHS), epoxy (such as novolac), and/or the like. The lower insulating film 520 may be formed by a vapor deposition process, a spin coating process, and/or the like.

The support pattern 500 may have a second length L2 along the first direction (X direction). The second length L2 of the support pattern 500 may be greater than the first length L1 of the semiconductor chip 400. The support pattern 500 may extend over a mounted region where the semiconductor chip 400 is mounted. The support pattern 500 may support the lower surface 100b of the film substrate 100 over the mounted region of the semiconductor chip 400. The support pattern 500 may extend in the same direction as a length direction of the semiconductor chip 400. For example, the support pattern 500 may extend from the front surface (third side surface) 102 of the film substrate 100 to the rear surface (fourth side surface) 104 opposite to the front surface 102.

The support pattern 500 may have a first thickness T1 and a first width W1. For example, the first thickness T1 of the support pattern 500 may be within a range of 5 μm to 200 μm. The first width W1 of the support pattern 500 may be within a range of 500 μm to 800 μm. In some example embodiments, the support pattern 500 may include, as (and/or in) the second metal lead portion 510 at least one of copper (Cu), aluminum (Al), tungsten (W), nickel (Ni), molybdenum (Mo), gold (Au), silver (Ag), chromium (Cr), tin (Sn), titanium (Ti), stainless (SUS). and/or the like.

In example embodiments, the semiconductor package 10 may further include an adhesive member 600 that fills a gap between the semiconductor chip 400 and the metal lead portion 200. The adhesive member 600 may fill a space between the semiconductor chip 400, the film substrate 100, the metal lead portion 200 and the upper insulating film 300. The adhesive member 600 may surround the conductive patterns 410 of the semiconductor chip 400 and fix the semiconductor chip 400 to the metal lead portion 200.

For example, the adhesive member 600 may include an epoxy molding compound (EMC). The adhesive member 600 may include epoxy resin, UV resin, polyurethane resin, silicone resin, silica filler, and/or the like.

In some example embodiments, each of the source drive substrate 30, the gate drive substrate 40, and the display panel 20 may be mounted on the metal lead portion 200. Each of the source drive substrate 30, the gate drive substrate 40, and the display panel 20 may be bonded to and electrically connected to the outer lead bonding portion 220 of the metal lead portion 200. For example, each of the source drive substrate 30, the gate drive substrate 40, and the display panel 20 may be bonded to the outer lead bonding portion 220 through the thermal compression process. For example, each of the source drive substrate 30, the gate drive substrate 40, and the display panel 20 may be electrically connected to the input/output pins IPIN, OPIN of the metal lead portion 200.

As described above, in a process of mounting the semiconductor chip 400 on the inner lead bonding portion 210 through the thermal compression process, the support pattern 500 may support the film substrate. Since the support pattern 500 supports the outer area (OLB area) of the film substrate where the outer lead bonding portion 220 is exposed, the support pattern 500 may generate a uniform shrinkage phenomenon of the film substrate 100 in the outer area. Therefore, when the uniform shrinkage phenomenon occurs in the film substrate 100, a rate of change of the film substrate 100 may be more accurately predicted. When the rate of change of the film substrate 100 is accurately predicted, a misalignment phenomenon may be prevented in a process of bonding another semiconductor device to the outer lead bonding portion 220.

Hereinafter, a method of manufacturing the semiconductor package in FIG. 1 will be described.

Figure 5:
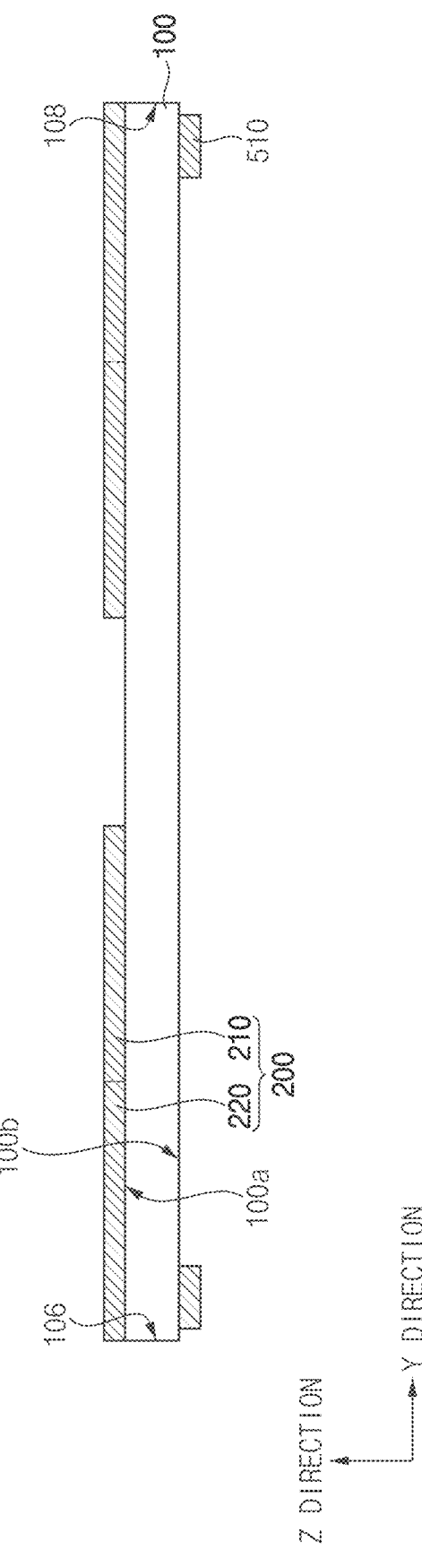
Figure 6:
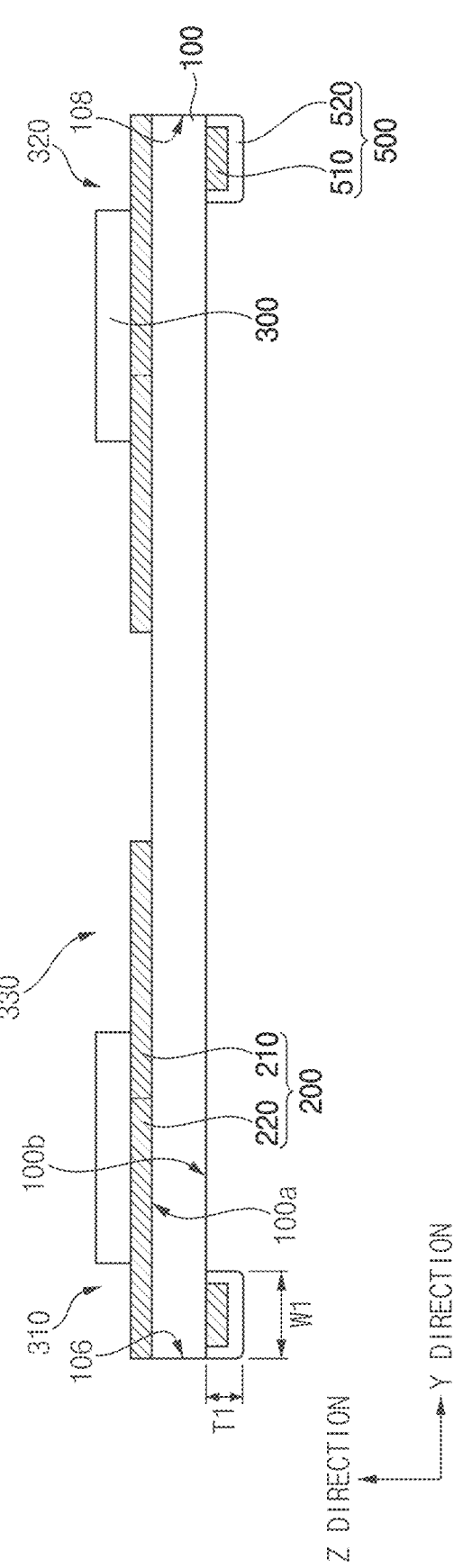
Figure 7:
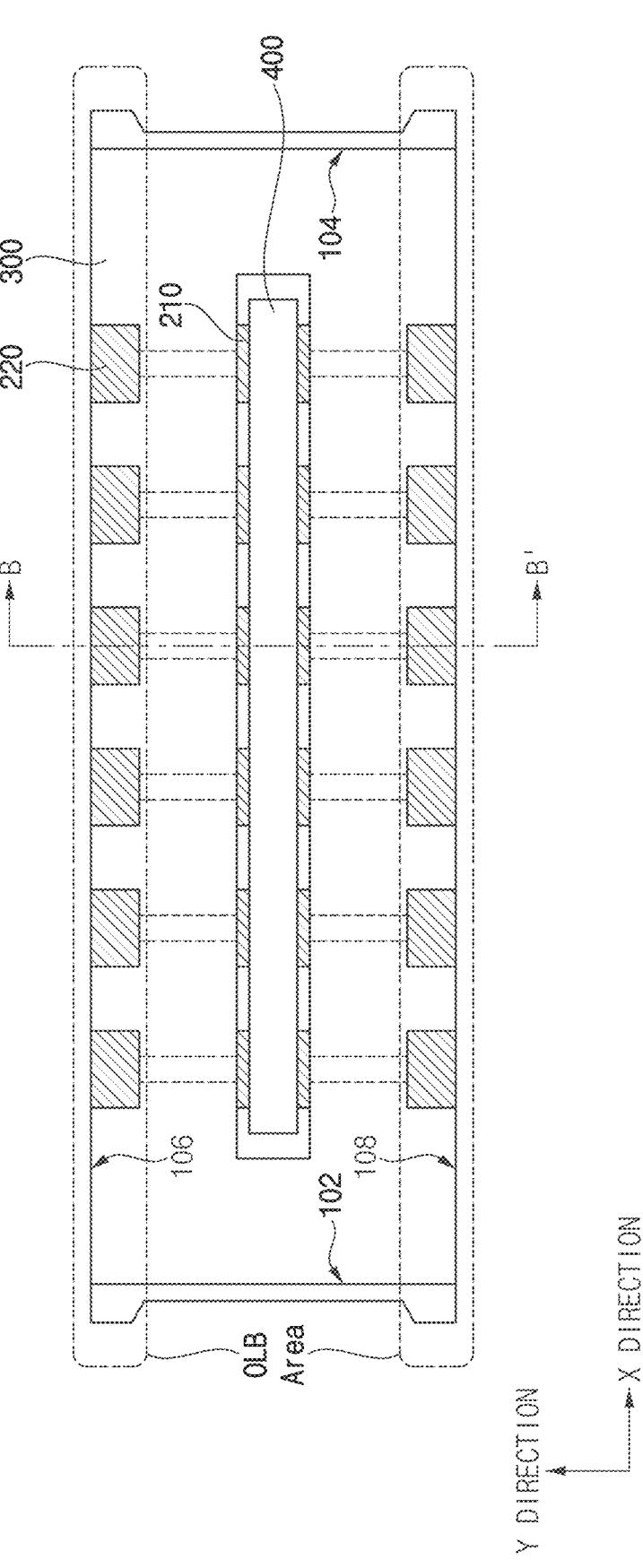
Figure 8:
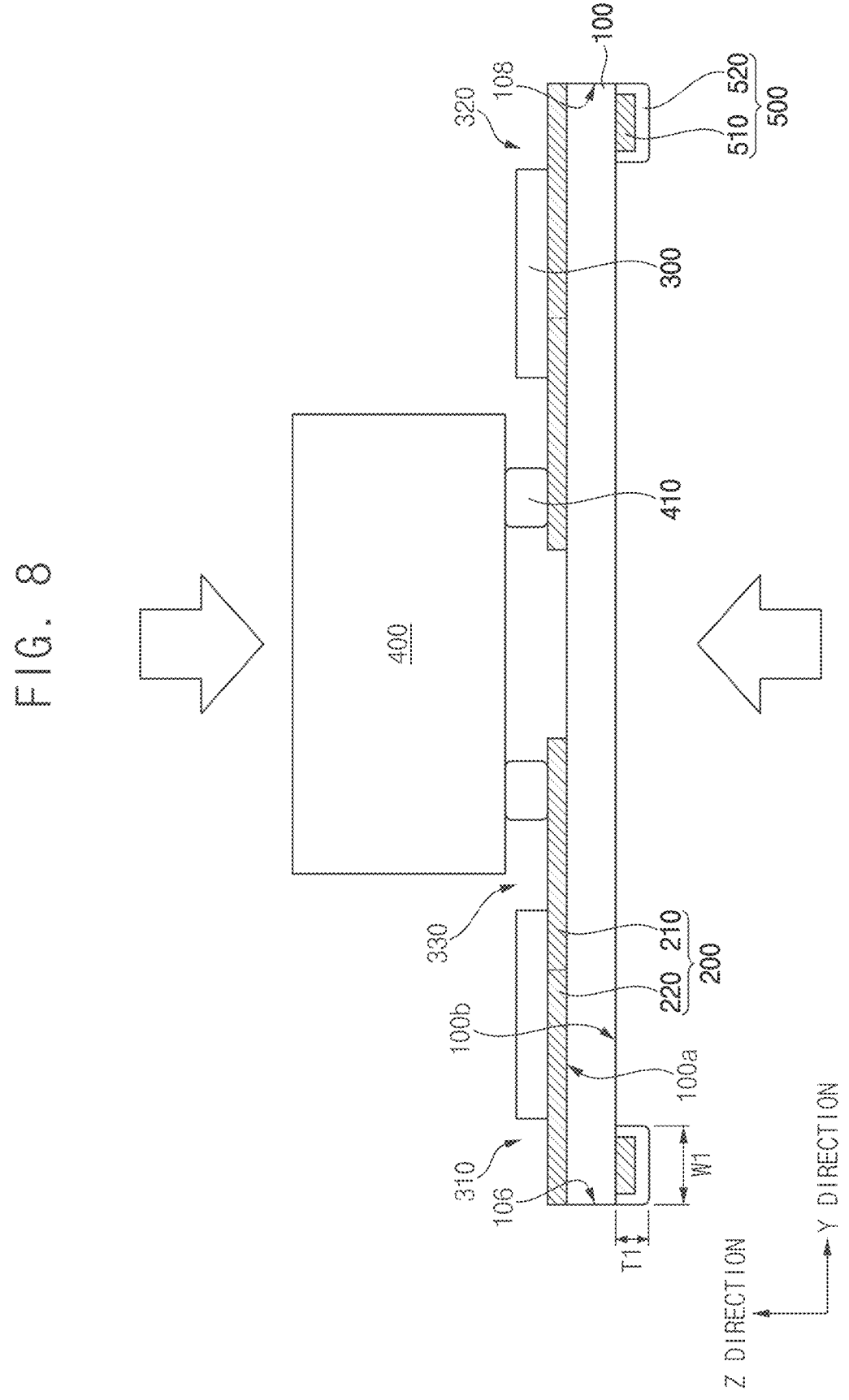

FIGS. 5 to 10 are cross-sectional views illustrating a method of manufacturing a semiconductor package in accordance with some example embodiments. FIG. 7 is a plan view illustrating a film substrate on which a semiconductor chip is mounted through a thermal compression process. FIG. 8 is a cross-sectional view taken along the line B-B' in FIG. 7.

Referring to FIG. 5, a first metal lead portion 200 may be formed on an upper surface 100a of a film substrate 100, and a second metal lead portion 510 may be formed on a lower surface 100b of the film substrate 100.

In example embodiments, the film substrate 100 may have the upper surface 100a and the lower surface 100b opposite to the upper surface 100a. The film substrate 100 may have a first direction (X direction) between a front surface (third side surface) 102 and an opposite rear surface (fourth side surface) 104, and a second direction (Y direction) orthogonal to the first direction (X direction).

In some example embodiments, the first metal lead portion 200 may extend in a length direction (e.g., the X direction) of the film substrate 100 on the upper surface 100a of the film substrate 100. The first metal lead portion 200 may be variously disposed on the film substrate 100 according to design.

The first metal lead portion 200 may include an inner leading bonding portion (ILB) 210 and an outer lead bonding portion (OLB) 220. The outer lead bonding portion 220 may be formed in an outer area (OLB area) extending along the first direction (X direction) on an outer area of the film substrate 100. The inner lead bonding portion 210 and the outer lead bonding portion 220 may extend from the upper surface 100a in the length direction of the film substrate 100.

In example embodiments, the second metal lead portion 510 may extend in the length direction of the film substrate 100 on the lower surface 100b of the film substrate 100. The second metal lead portion 510 may be formed in the outer area (OLB area). For example, the second metal lead portion 510 may include a square bar shape, a semicircular bar shape, or the like.

Referring to FIG. 6, an upper insulating film 300 may be formed on the first metal lead portion 200, and a lower insulating film 520 may be formed on the second metal lead portion 510.

In some example embodiments, the upper insulating film 300 may be formed on a boundary region where the inner lead bonding portion 210 and the outer lead bonding portion 220 extend from each other.

The upper insulating film 300 may expose at least a portion of the outer lead bonding portion 220. The upper insulating film 300 may expose input pins and output pins of the outer lead bonding portion 220. The upper insulating film 300 may have a ring shape with a set (e.g., a preset) gap. A plurality of first and second pad openings 310 and 320 may be formed to electrically connect at least the portion of the exposed outer lead bonding portion 220 on the upper insulating film 300 to each of a semiconductor chip 400, a display panel, a source drive substrate, or a gate drive substrate.

The upper insulating film 300 may expose at least a portion of the inner lead bonding portion 210. The upper insulating film 300 may expose at least the portion of the inner lead bonding portion 210 along the first direction (X direction). The upper insulating film 300 may include a mounting region opening 330 that exposes the inner lead bonding portion 210. The mounting region opening 330 may extend along an inner side of the ring shape within the upper insulating film 300.

The first and second pad openings 310 and 320 and the mounting region opening 330 may be formed through an etching process. For example, the etching process may include a wet etching process, a dry etching process, a plasma etching process, and/or the like.

A lower insulating film 520 may cover the second metal lead portion 510 and extend along the second metal lead portion 510. The lower insulating film 520 may protect the second metal lead portion 510 from an outside by covering the second metal lead portion 510.

The lower insulating film 520 and the second metal lead portion 510 may be combined to form the support pattern 500.

The support pattern 500 may have a first thickness T1 and a first width W1. For example, the first thickness T1 of the support pattern 500 may be within a range of 5 μm to 200 μm. The first width W1 of the support pattern 500 may be within a range of 500 μm to 800 μm.

The upper insulating film 300 may be formed by a vapor deposition process, a spin coating process, and/or the like.

Referring to FIGS. 7 to 8, a semiconductor chip 400 may be mounted on the first metal lead portion 200.

In some example embodiments, the semiconductor chip 400 may be bonded to and electrically connected to the inner lead bonding portion 210 of the first metal lead portion 200. For example, the semiconductor chip 400 may be bonded to the inner lead bonding portion 210 through a thermal compression process. The conductive patterns 410 may bond and electrically connect the semiconductor chip 400 to the inner lead bonding portion 210 of the metal lead portion

200. The semiconductor chip 400 may be electrically connected to the input/output pins IPIN, OPIN of the metal lead portion 200.

In some example embodiments, the film substrate 100 may be disposed on a bonding stage during the mounting operation, and the semiconductor chip 400 may be mounted on the film substrate 100. The conductive patterns 410 of the semiconductor chip 400 may be positioned on the inner lead bonding portion 210 of the first metal lead portion 200.

In some example embodiments, a bonding tool (not illustrated) may be placed on the semiconductor chip 400 that is aligned on the first metal lead portion 200. The first metal lead portion 200 and the semiconductor chip 400 may be bonded by applying pressure between the bonding tool and the bonding stage. The semiconductor chip 400 may be attached to the first metal lead portion 200 by performing the thermal compression process at a predetermined (or otherwise determined) temperature such that the semiconductor chip 400 and the first metal lead portion 200 may be bonded to each other through the thermal compression process. For example, the conductive patterns 410 of the semiconductor chip 400 may be bonded to the first metal lead portion 200 through the thermal compression process.

Figure 9:
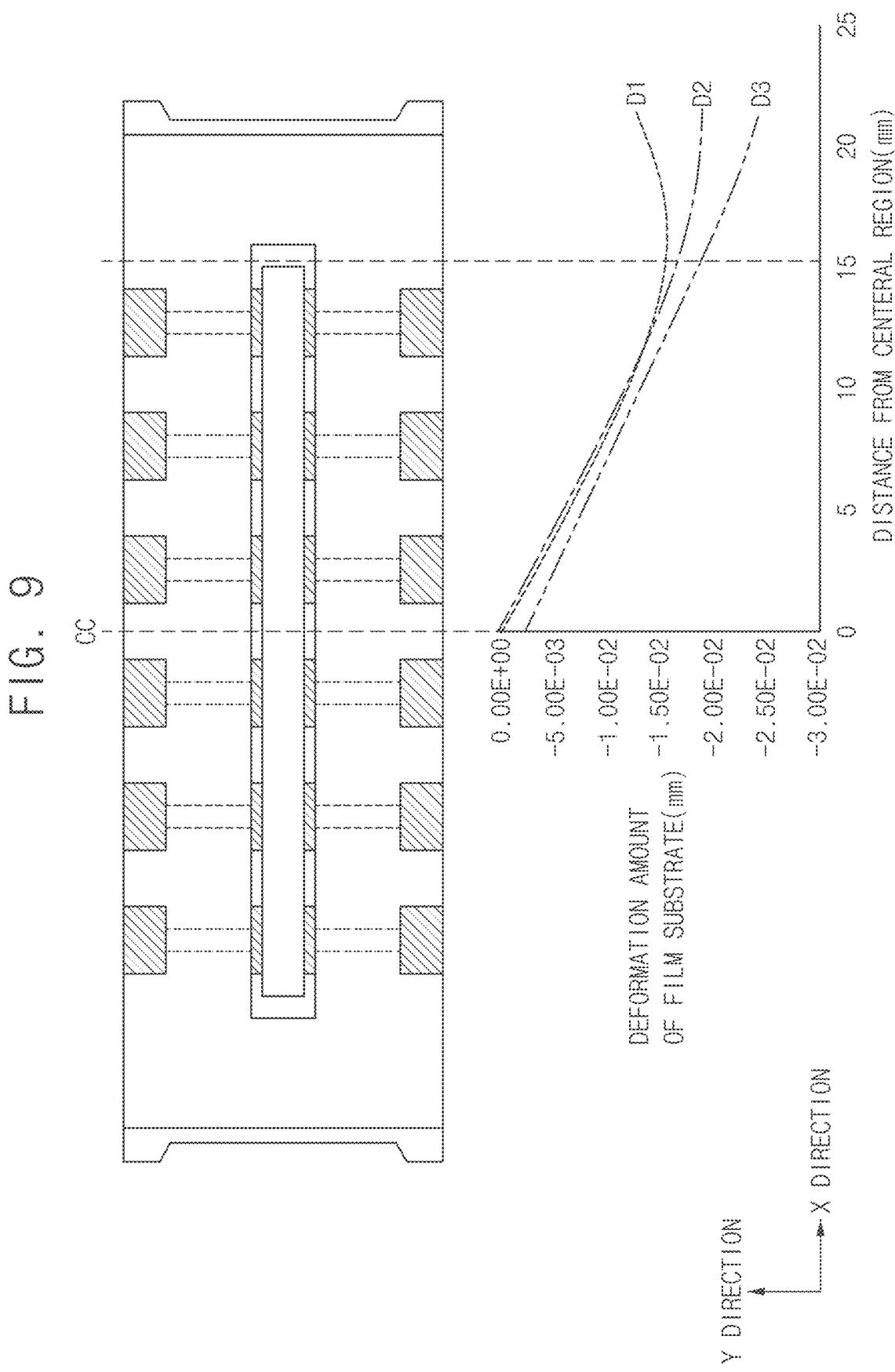

Referring to FIG. 9, an undulation phenomenon may occur in the film substrate 100 during the thermal compression process of bonding the semiconductor chip 400 and the first metal lead portion 200.

In some example embodiments, the film substrate 100 may be deformed by the thermal compression process. For example, during the bonding of the semiconductor chip 400 to the first metal lead portion 200, the film substrate 100 may expand due to the higher temperature heat, and may shrink during the cooling to room temperature. In some example embodiments, the undulation phenomenon may refer to a phenomenon that is occurred in the film substrate 100 due to shrinkage deformation and expansion deformation depending on the position of the film substrate 100. For example, without being limited to a specific theory, the expansion and shrinkage may be uneven due to, e.g., the different thermal expansion coefficients, thicknesses, compositions, etc. of the film type semiconductor package 10. When another semiconductor device is mounted on the outer lead bonding portion 220 due to an undulation shape, a misalignment phenomenon may occur. For example, a pad (not illustrated) and/or a conductive pattern 410 may be misaligned to a corresponding inner lead bonding portion 210 due to the undulation.

A first data D1 may be referred to data that represents a deformation amount of the film substrate 100 when the semiconductor chip 400 is mounted on the film substrate 100 in a state where the support pattern 500 is not formed. The shrinkage deformation may occur in the film substrate 100 around a mounted region where the semiconductor chip 400 is mounted. The expansion deformation may occur in the film substrate 100 in areas other than the mounted region. As a distance from a central region CC of the film substrate 100 increases, the shrinkage deformation may occur and then the expansion deformation may occur, sequentially.

When the support pattern 500 is not formed, complex deformation may occur in the film substrate 100. The complex deformation may be referred to a deformation in which both the shrinkage deformation and the expansion deformation occur. When the complex deformation occurs on the film substrate 100, a non-linear and/or an unpredictable undulation phenomenon may occur.

A second data D2 may be referred to data that represents deformation amount of the film substrate 100 when the semiconductor chip 400 is mounted on the film substrate 100 in a state in which the support pattern 500 is formed. The second data may be referred to data that represents a deformation amount of the film substrate 100 when the first thickness T1 of the support pattern 500 is 8 μm.

When the support pattern 500 is formed, the shrinkage deformation may occur uniformly as the distance from the central region CC of the film substrate 100 increases. When the support pattern 500 is formed, a deformation amount of the film substrate 100 according to the distance from the central region CC of the film substrate 100 may be linear, substantially linear (or constant). When the support pattern 500 is formed, the deformation amount of the film substrate 100 may increase. Even if the deformation amount is increases, since the shrinkage deformation of the film substrate 100 is constantly generated, a degree of the deformation may be predicted more easily.

The support pattern 500 may support the outer lead bonding portion 220 of the first metal lead portion 200 on the lower surface 100b of the film substrate 100 and may increase a rigidity of the outer lead bonding portion 220. The support pattern 500 may generate the uniform shrinkage deformation on the film substrate 100 in the thermal compression process. When the uniform shrinkage deformation occurs on the film substrate 100, the degree of the deformation of the film substrate 100 may be predicted.

A third data D3 may referred to data that represents a deformation amount of the film substrate 100 when the semiconductor chip 400 is mounted on the film substrate 100 in a state in which the support pattern 500 is formed. The third data may be referred to data that represents the deformation amount of the film substrate 100 when the first thickness T1 of the support pattern 500 is 20 μm.

When the first thickness T1 of the support pattern 500 increases, the deformation amount of the film substrate 100 according to the distance from the central region CC of the film substrate 100 may be more linear (or constant). When the first thickness T1 of the support pattern 500 increases, a degree of the deformation may be predicted more easily.

The support pattern 500 may support the outer lead bonding portion 220 of the first metal lead portion 200 on the lower surface 100b of the film substrate 100 and may increase the rigidity of the outer lead bonding portion 220. When the first thickness T1 of the support pattern 500 is 20 μm the deformation amount of the film substrate 100 may be more constant and a degree of occurrence of the expansion deformation may be predicted more easily compared to when the support pattern 500 is 8 μm.

Figure 10:
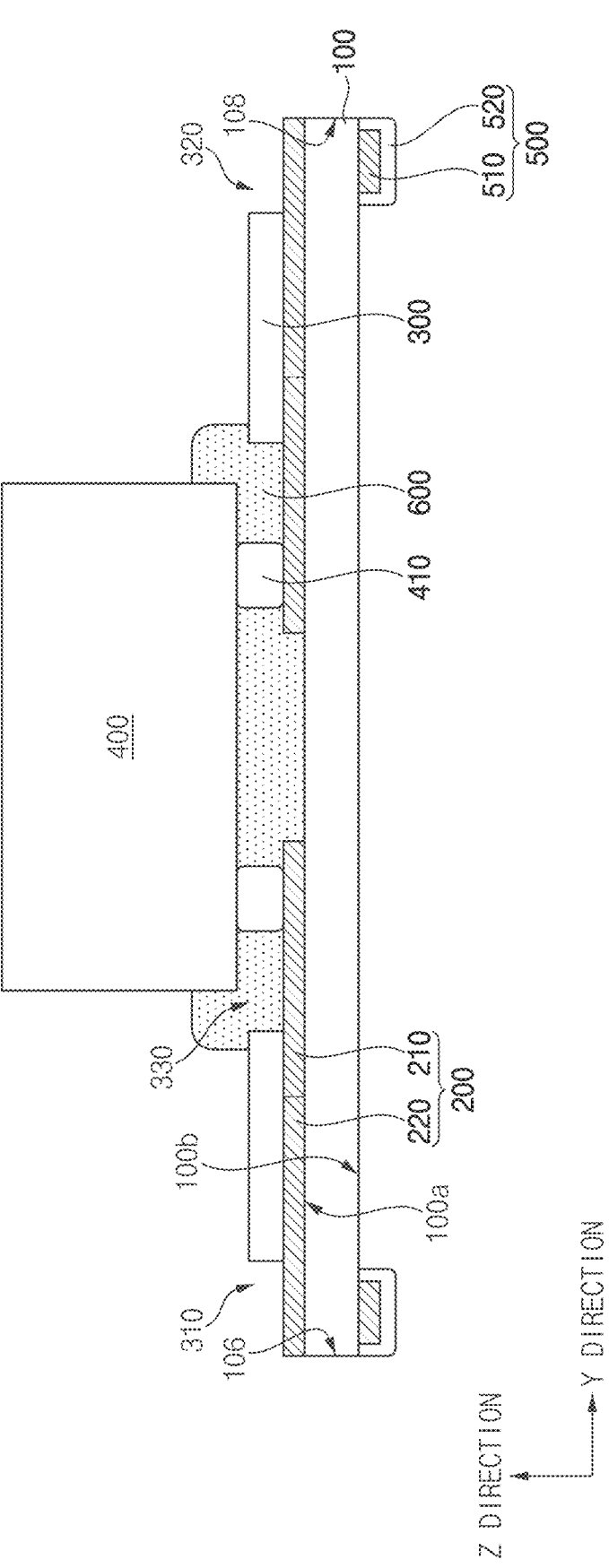

Referring to FIG. 10, an adhesive member 600 may be formed between the semiconductor chip 400 and the film substrate 100.

In some example embodiments, the adhesive member 600 may be applied to fill a space between the semiconductor chip 400, the film substrate 100, the metal lead portion 200 and the upper insulating film 300. The adhesive member 600 may surround the conductive patterns 410 of the semiconductor chip 400 and fix the semiconductor chip 400 on the first metal lead portion 200.

In some example embodiments, the adhesive member 600 may include an epoxy molding compound (EMC). For example, the adhesive member 600 may include at least one of epoxy resin, UV resin, polyurethane resin, silicone resin, silica filler, and/or the like.

The foregoing is illustrative of some example embodiments and is not to be construed as limiting thereof. Although a few example embodiments have been described, those skilled in the art will readily appreciate that many modifications are possible to the example embodiments without materially departing from the novel teachings and advantages of the present invention. Accordingly, all such modifications are intended to be included within the scope of example embodiments as defined in the claims.

What is claimed is:

1. A semiconductor package, comprising:
a film substrate including a chip mounting region, an upper surface, a lower surface, a first side surface, and a second side surface, the first side surface and the second side surface extending in a first direction, and the film substrate is elongated in the first direction;
a plurality of wires on the upper surface of the film substrate, the plurality of wires including a metal lead portion having an inner lead bonding portion at least partially within the chip mounting region and an outer lead bonding portion extending from the inner lead bonding portion to at least one of the first side surface or the second side surface;
an upper insulating film on the upper surface of the film substrate, the upper insulating film defining a plurality of pad openings and a mounting region opening such that the plurality of pad openings exposes at least a portion of the outer lead bonding portion along the at least one of the first side surface or the second side surface, and the mounting region opening exposes at least a portion of the inner lead bonding portion on the chip mounting region;
a semiconductor chip on the chip mounting region of the film substrate such that the semiconductor chip is bonded to and electrically connected to the exposed inner lead bonding portion; and
at least one support pattern on the lower surface of the film substrate and extending in the first direction such that the at least one support pattern overlaps with the plurality of pad openings along at least one of the first side surface or the second side surface,
wherein the at least one support pattern each includes
a second metal lead portion extending on the lower surface of the film substrate in the first direction, and
a lower insulating film enveloping the second metal lead portion, and
wherein the at least one support pattern is spaced apart from the semiconductor chip in a plan view.

2. The semiconductor package of claim 1, wherein the second metal lead portion is electrically insulated from the semiconductor chip.

3. The semiconductor package of claim 1, wherein a length of the at least one support pattern in the first direction is greater than a length of the semiconductor chip in the first direction.

4. The semiconductor package of claim 1, wherein the film substrate includes a third side surface adjacent to the first side surface and a fourth side surface opposite to the third side surface, and the at least one support pattern extends from the third side surface to the fourth side surface.

5. The semiconductor package of claim 1, wherein a thickness of the at least one support pattern is within a range of 5 μm to 200 μm.

6. The semiconductor package of claim 1, wherein the at least one support pattern includes a first support pattern extending along the first side surface of the film substrate and a second support pattern extending along the second side surface of the film substrate.

7. The semiconductor package of claim 1, wherein the plurality of pad openings includes first openings arranged along the first side surface of the film substrate and second openings arranged along the second side surface of the film substrate.

8. The semiconductor package of claim 7, wherein the outer lead bonding portion exposed through the first openings are electrically connected to a display panel, and the outer lead bonding portion exposed through the second openings are electrically connected to a source drive substrate or a gate drive substrate.

9. The semiconductor package of claim 1, further comprising:

an adhesive member filling a space between at least a portion of the exposed inner lead bonding portion, the semiconductor chip, and the upper insulating film.

10. The semiconductor package of claim 1, wherein the at least one support pattern includes at least one of copper (Cu), aluminum (Al), tungsten (W), nickel (Ni), molybdenum (Mo), gold (Au), silver (Ag), chromium (Cr), tin (Sn), titanium (Ti), or Stainless steel (SUS).

11. A semiconductor package, comprising:

a film substrate including a chip mounting region, an upper surface, a lower surface, a first side surface, and a second side surface, the first side surface and the second side surface extending in a first direction, and the film substrate is elongated in the first direction;

a plurality of wires on the upper surface of the film substrate, the plurality of wires including a metal lead portion having an inner lead bonding portion at least partially within the chip mounting region and outer lead bonding portions respectively extending from the inner lead bonding portion to one of the first side surface or the second side surface;

an upper insulating film on the upper surface of the film substrate and covering the plurality of wires, the upper insulating film defining a plurality of pad openings and a mounting region opening such that the plurality of pad openings exposes at least a portion of the outer lead bonding portions along the first side surface and the second side surface, and the mounting region opening exposes at least a portion of the inner lead bonding portion on the chip mounting region along the first direction;

a semiconductor chip on the chip mounting region of the film substrate such that the semiconductor chip is bonded to and electrically connected to the exposed inner lead bonding portion; and a first support pattern and a second support pattern on the lower surface of the film substrate and respectively extending in the first direction to overlap with the plurality of pad openings along the first side surface and the second side surface, wherein each of the first support pattern and the second support pattern includes, a second metal lead portion extending on the lower surface of the film substrate in the first direction and electrically insulated from the semiconductor chip, and a lower insulating film enveloping the second metal lead portion, and wherein each of the first support pattern and the second support pattern is spaced apart from the semiconductor chip in a plan view.

12. The semiconductor package of claim 11, the second metal lead portion is electrically insulated from the semiconductor chip.

13. The semiconductor package of claim 11, wherein a length of each of the first support pattern and the second support pattern in first direction is greater than a length of the semiconductor chip in the first direction.

14. The semiconductor package of claim 11, wherein the film substrate includes a third side surface adjacent to the first side surface and a fourth side surface opposite to the third side surface, and each of the first and second support patterns extends from the third side surface to the fourth side surface.

15. The semiconductor package of claim 11, wherein a thickness of each of the first support pattern and the second support pattern is within a range of 5 μm to 200 μm.

16. The semiconductor package of claim 11, wherein the plurality of pad openings includes first openings arranged along the first side surface of the film substrate and second openings arranged along the second side surface of the film substrate.

17. The semiconductor package of claim 16, wherein the outer lead bonding portions exposed through the first openings are electrically connected to a display panel, and the outer lead bonding portions exposed through the second openings are electrically connected to a source drive substrate or a gate drive substrate.

18. The semiconductor package of claim 11, further comprising:

an adhesive member filling a space between at least a portion of the exposed inner lead bonding portion, the semiconductor chip, and the upper insulating film.

19. The semiconductor package of claim 11, wherein the first support pattern and the second support pattern each include at least one of copper (Cu), aluminum (Al), tungsten (W), nickel (Ni), molybdenum (Mo), gold (Au), silver (Ag), chromium (Cr), tin (Sn), titanium (Ti), or Stainless steel (SUS).

20. A semiconductor package, comprising:

a film substrate including an upper surface, a lower surface;

a plurality of wires on the upper surface of the film substrate, the plurality of wires including a metal lead portion having an inner lead bonding portion, at least one first outer lead bonding portion extending from the inner lead bonding portion and at least one second outer lead bonding portion extending from the inner lead bonding portion in a direction opposite to the at least one first outer lead bonding portion;

an upper insulating film on the plurality of wires, the upper insulating film defining a plurality of pad openings and a mounting region opening such that the plurality of pad openings are arranged along a first direction and expose outer ends of the at least one first outer lead bond portion and of the at least one second outer lead bonding portion, and the mounting region opening exposing at least a portion of the inner lead bonding portion along the first direction;

a semiconductor device on the film substrate such that the semiconductor device is bonded to and electrically connected to the exposed inner lead bonding portion;

an adhesive member filling a space between the film substrate and the semiconductor device; and a first support pattern and a second support pattern on the lower surface of the film substrate and respectively extending from a front surface of the film substrate to a rear surface opposite to the front surface such that the first and second support patterns respectively overlap with outer ends of the exposed first outer lead bonding portions and of the exposed second outer lead bonding portions, wherein each of the first support pattern and the second support pattern includes, a second metal lead portion extending on the lower surface of the film substrate in the first direction and electrically insulated from the semiconductor device, and a lower insulating film enveloping the second metal lead portion, and wherein each of the first support pattern and the second support pattern is spaced apart from the semiconductor device in a plan view.

* * * * *